July 12, 1966 A. KAISER ETAL 3,260,957
COMPENSATED PLATFORM GAIN CONTROL APPARATUS
Filed April 2, 1963
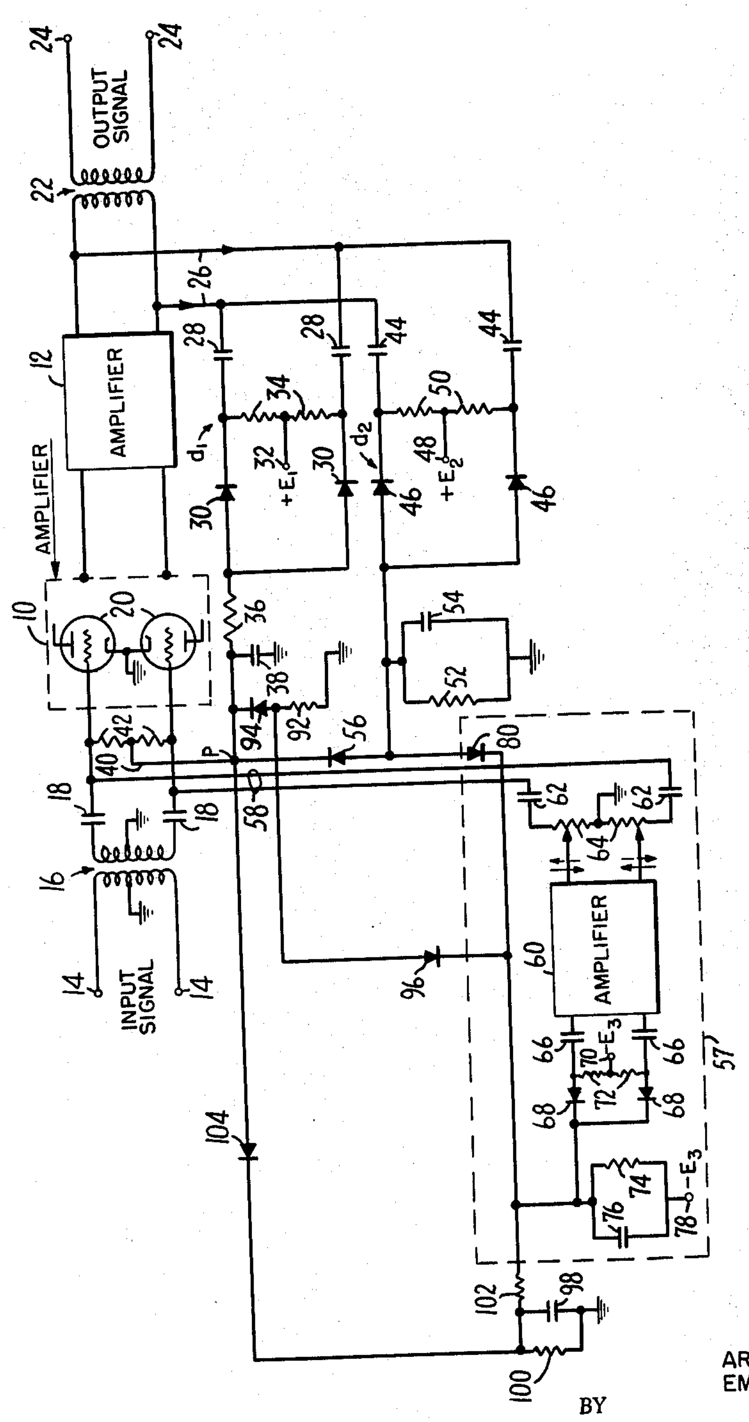
INVENTORS
ARTHUR KAISER &
EMIL TORICK
BY
Brumbaugh, Free, Graves & Donohue
their ATTORNEYS United States Patent Office 3,260,957
Patented July 12, 1966

3,260,957

COMPENSATED PLATFORM GAIN CONTROL APPARATUS

Arthur Kaiser, Trumbull, and Emil Torick, Norwalk, Conn., assignors to Columbia Broadcasting System, Inc., New York, N.Y., a corporation of New York Filed Apr. 2, 1963, Ser. No. 269,927
9 Claims. (Cl. 330—134)

This invention relates to automatic gain control arrangements for amplifiers, and more particularly to an improved amplifier signal level control of the platform type.

In copending patent application Serial No. 173,281, filed February 14, 1962, for "Gain Control Apparatus Providing Constant Gain Interval," and assigned to the present assignee, issued June 1, 1965, as Patent No. 3,187,-268, there is described an automatic signal level control apparatus for a broadcast or recording input audio signal amplifying channel employing what is termed the "platform" principle of operation.

In conventional gain control systems, the amplifier gain tends to follow directly the signal amplitude contour. In accordance with platform operation, a reduction of signal level of a preselected amount takes place before an increase in amplifier gain is effected. During the platform interval, i.e., that period between a decrease in signal amplitude and increase in gain of the amplifier, the gain of the amplifier is maintained constant. There is thus permitted a range of signal level variation without modification of the amplifier gain, tending to make the resultant audio signal less sensitive to sudden, short duration changes in input level and more pleasing to the human ear.

The platform operation is achieved, according to the aforementioned copending application, by providing a pair of feedback paths for generating gain control potentials. The first of these paths includes a detector for rectifying the output signal of the amplifier and providing a D.C. voltage across a storage device such as a capacitor, which voltage is the gain control bias for an amplifier stage having, for example, a variable mu tube as the controllable amplifying device. The second path includes a similar detector, but is arranged to provide a D.C. potential of greater magnitude than that of the first-mentioned path. The latter detector is coupled to the aforementioned storage device by comparison means. Below a predetermined signal level, no rectification occurs in the detector in the first feedback path and the amplifier operates at a constant gain point determined by its initial bias conditions. Once this predetermined level is reached however, rectification takes place and a voltage is developed across the storage device which is applied to the amplifier to decrease its gain.

When the signal level decreases, the output of the second detector, which is applied to the comparison means, prevents a change in the voltage across the storage device until a predetermined drop in signal level has occurred. Once this drop is exceeded, the comparator permits the first detector circuit to alter the control voltage on the storage device and thereby increase the gain of the amplifier. There is also provided a gating circuit which is responsive to input signal levels below a predetermined threshold amplitude for effectively disconnecting the second feedback circuit from the gain control apparatus. The gating circuit prevents the large increases in amplifier gain which would occur during periods of prolonged silence or very low amplitude input. As soon as input above the threshold level is resumed, the gate is rendered inoperative and the normal platform gain control operation is resumed.

It is the primary object of the present invention to provide an improved gain control arrangement of the platform type including additional features for further improving the quality and clarity of an audio signal provided by the controlled amplifier.

A further object of the invention is to provide means for permitting slow readjustments of amplifier gain resulting from average level changes smaller than the range of the gain platform.

Still another object of the invention is to provide an improved gated platform gain control arrangement wherein the amplifier gain is automatically returned to a predetermined normal level upon continuance of a low or zero level input beyond a given interval.

Yet another object of the invention is to provide an improved gated platform gain control arrangement wherein normal gain of the amplifier is maintained during extended periods of zero or low input signal level, in spite of occasional sounds of relatively high level.

Briefly, the present invention provides a discharge path and a charge path across the control signal storage element of the platform gain control circuit of the aforementioned patent, both of which are controlled by the condition of the gate circuit of the gain control apparatus.

The discharge path is operable while the gate circuit is not effective, i.e., when the input signal is above the threshold level, and while the circuit is operating within the platform range. The discharge path permits a very slow gain increase to take place when the signal level drops by an amount less than the gain platform. The gain increase is effective to offset the steady drop in speech level which normally commences with the first words spoken after taking a breath and continues to the last words before the next breath, and also to permit a slow readjustment in gain caused by average level changes less than the range of the gain platform.

The charge path is rendered operative while the gate circuit of the gain control arrangement is operative, i.e., when the input signal level to the amplifier is below the threshold value. The path includes an RC circuit dimensioned to charge to a voltage value capable of biasing the amplifier to a normal gain condition, while RC circuit is coupled to the control voltage storage device through a diode. The RC circuit is arranged to reach the prescribed voltage level after a predetermined interval, e.g., ten seconds, of operation of the gate circuit. If, at the end of this time, the voltage on the control signal storage device is more positive than the prescribed level, indicating that the gain of the amplifier is high, the diode is rendered conductive and the storage element charges to the level providing the normal gain.

Working in conjunction with each other, the two paths serve to maintain normal gain of the amplifier during extended periods of signal input below the threshold level, even though occasional short duration sounds above the threshold level occur.

The aforementioned objects, features and advantages of the present invention will become more apparent from the following detailed description thereof when taken in conjunction with the accompanying drawing, the single figure of which is a circuit diagram of a platform gain control arrangement incorporating the present invention.

Referring now to the drawing, an audio signal transmission channel, suitable for use as a broadcast transmitter input or as the input to a recording apparatus, may conveniently consist of a pair of amplifier stages 10 and 12, one of which is provided with a variable gain feature. As illustrated in the drawing, the amplifier 10 is indicated as being of the push-pull type including a pair of amplifier tubes 20 having a variable gain characteristic, e.g., type 6386, and whose outputs are supplied to succeeding circuitry in the amplifier. For the sake of simplicity, the details of the amplifier 10 are omitted, it being obvious that one skilled in the art could supply the required circuitry.

Audio input signals, such as from a microphone, are applied across the input terminals 14. Transformer 16 couples the input signals through D.C. blocking capacitors 18 to the respective input grids of the tubes 20 in conventional push-pull fashion. The output of amplifier 10 provides the input to an additional amplifier 12 whose output is coupled via transformer 22 to the output terminals 24.

The gain control circuitry comprises a first feedback loop including conductors 26 coupling the output of amplifier 12 through coupling capacitors 28 to the cathodes, or negative electrodes, of a pair of rectifying devices 30. These diodes may be either of the thermionic or semiconductor variety and have their positive terminals connected in common to form a full wave rectifier $d_1$. A source of positive D.C. voltage $+E_1$ is coupled at terminal 32 and through resistors 34 to the respective cathodes of the diode 30. The common connection of the diodes 30 is coupled through resistor 36 to one side of a voltage storage capacitor 38, the other terminal of which is grounded. The capacitor is also coupled at point $p$ and via conductor 40 to the midpoint of grid return resistors 42 connected across the control grids of the amplifier tubes 20.

As long as the output of amplifier 12 is of a magnitude less than the value $+E_1$, no conduction takes place through the diodes 30 and no control voltage is applied to the tubes 20. The latter will then operate at a constant gain point established by the initial biasing conditions. When the output voltage reaches a peak value exceeding the value $+E_1$, the diodes 30 are rendered conductive on the negative peaks of the signal and rectification thereof occurs. The negative voltage resulting therefrom charges capacitor 38 quickly through resistor 36 and applies a control potential through resistors 42 to the amplifier tubes 20. The point at which the control voltage is generated is set by selection of the magnitude of $+E_1$ and the values of capacitor 38 and resistor 36 are chosen to provide a time constant enabling the charge on the capacitor to closely follow the D.C. voltage output of the detector $d_1$.

To provide the platform action, i.e., permit the gain of the amplifier to increase after a predetermined decrease in input signal, an auxiliary feedback loop is provided. This loop includes a peak detector arrangement, indicated generally at $d_2$, similar to the detector $d_1$. Conductors 26 supply the output audio signal through D.C. blocking capacitors 44 to the cathode terminals of the diodes 46. A source of positive voltage $+E_2$ is applied at terminal 48 and thence through equal resistors 50 to the cathodes of the diodes.

The anodes of the rectifying devices 46 are connected in common to provide full wave rectification and are coupled to one terminal of a parallel RC network comprising resistor 52 and capacitor 54, the other terminals of which are connected to ground. A unidirectional conducting device 56, such as a semiconductor diode for example, is connected between the output of the rectifier $d_2$ and the point $p$, the device being poled so as to be conductive only when the output of $d_2$ is more positive than the potential at point $p$.

The platform is established by making the voltage $+E_2$ smaller, i.e., less positive, than the voltage $+E_1$, in practice $+E_2$ being approximately 1/3 the value of $+E_1$ for a ten db platform. Since both rectifiers $d_1$ and $d_2$ are provided with the same input signal, the rectifier $d_2$ will develop a negative voltage at lower signal levels than rectifier $d_1$ and its output will always be more negative than the output of $d_1$ for the same values of amplifier output signal. Capacitor 54 is charged to a value corresponding to the rectified voltage but the output of this circuit is effectively isolated from the amplifier control grids by diode 56. By virtue of the leakage path through resistor 52 to ground, the charge on capacitor 54 will vary with the level of the output of the amplifier.

When the output signal of the amplifier decreases in magnitude beyond the predetermined platform, the output of the rectifier $d_2$ becomes equal to the voltage stored in the capacitor 38. At this point, diode 56 becomes forward biased and conducts, establishing a discharge path for capacitor 38 through the diode 56 and resistor 52. As the capacitor 38 discharges, the control voltage applied to the tubes 20 becomes more positive and the gain of the amplifiers is increased.

To accommodate program material wherein extended periods of no or very low audio input often occur, such as in television broadcasting, a gating circuit indicated generally at 57 is included. The circuit is coupled via conductors 58 to receive a portion of the input signal to the amplifier 10. The signal is coupled through blocking capacitors 62 and complementary voltage controlling potentiometers 64 to the input of a high gain push-pull amplifier 60 whose output is connected through coupling capacitor 66 to the anodes of a pair of unidirectionally conducting devices 68. The latter may be of any well known type. A source of negative D.C. voltage, $-E_3$, is coupled to terminal 70 and via equal resistors 72 to the positive terminals or anodes of the diodes 68.

The cathodes of the diodes 68 are connected in common to provide full wave rectification and the rectified output is connected to one terminal of a parallel RC combination comprising resistor 74 and capacitor 76, the other terminal 78 being returned to the voltage source $-E_3$. The upper terminal of the RC circuit is connected to the negative electrode or cathode of a diode 80, the anode of which is coupled to the anode of the diode 56.

As long as the amplifier input signal exceeds a threshold level selected by an adjustment of complementary potentiometers 64, high gain amplifier 60 provides an input to the diodes 68 which, by virtue of their positive rectification provide a high positive voltage at the upper terminal of the RC network 74, 76. Amplifier 60 is designed to provide sufficient amplification so that its output, when rectified by the diodes 68 and added to $-E_3$, will be more positive than the output of $d_2$ for any value of signal input above the threshold. Under these conditions, in the presence of a signal above the threshold level, diode 80 is reverse biased and the gate network is effectively isolated from the remainder of the circuit and inoperative. The platform circuit is thus free to operate in its normal manner.

Should the input signal decrease to a value below the threshold, capacitor 76 discharges through resistor 74 to voltage level $-E_3$, applying a negative voltage to the cathode terminal of the diode 80 and rendering it conductive. This lowers the potential at the anode of diode 56 below its cathode potential thereby preventing any possible discharge path for the capacitor 38 to be established. The gate arrangement thus effectively suspends platform operation during prolonged periods of little or no input signal. Upon resumption of input signal above the threshold level, capacitor 76 is quickly charged to a high positive value, reverse biasing diode 80 and permitting the remainder of the circuit to function in its normal manner.

All of the foregoing circuitry is described in the aforementioned patent.

It has been found that during the course of normal speech, the audio level is at its highest for the first words spoken after taking a breath and tends to drop gradually until the last words prior to the next breath. This drop in level will generally lie completely within the platform range and thus does not cause a change in amplifier gain. Other factors also contribute to effect a small decrease in average signal level falling within the platform range. To improve the quality of the output signal, it is desirable to offset these gradual signal level drops, but at the same time, such offsetting action must not produce a gain change during low signal input periods when the gate network 57 is operative.

To accomplish this, a slow leakage path for the control voltage storage capacitor 38 is provided, including a large resistor 92 and a diode 94 in series, connected in parallel with the capacitor. An additional diode 96 has its cathode connected to the upper terminal of the RC network 74, 76 in the gate circuit and its anode connected to the junction of the diode 94 and resistor 92. When the amplifier input signals are above the threshold level, diode 94 will be forward biased permitting conduction through resistor 92 and capacitor 38 to gradually raise the voltage thereon to a more positive level, and accordingly the gain of the amplifier, to compensate for gradual diminution of signal amplitudes. However, should the signal input level decrease below the threshold level so as to render gate circuit 57 operative, the potential on the cathode terminal of diode 96 becomes highly negative, rendering the diode 96 conductive. This in turn causes the anode of diode 94 to become highly negative and thus non-conductive. As long as this condition prevails, capacitor 38 will have no discharge path and the gain control voltage will remain constant. The slow gain recovery provided by the resistor 92 is thereby available only when the gate circuit is not operating.

If, prior to a complete cessation of input signal or a drop below the threshold level, the gain of the system was above the normal value (because of a drop in signal level preceding the cessation), the capacitor 38 would retain the corresponding small control voltage during the operative period of the gate. If the resumption of input signals was preceded by low background noise or audience sounds, they would be unduly amplified because of the high gain at which the system was set. The aforementioned charge path for the capacitor 38 avoids this undesirable effect.

The charge path comprises a diode 104 having its anode terminal connected to point *p* and its cathode connected through series resistor 102 to the upper terminal of the RC network 74, 76 in the gate circuit 57. A parallel resistance-capacitance circuit, 100, 98, is connected between the common terminal of resistor 102 and diode 104, and ground.

The charging and discharging time of the capacitor 98 is arranged to have a given interval, e.g., ten seconds. When the input signal level falls below the threshold level to thereby render the gate network 57 operative, capacitor 98 charges slowly to a predetermined voltage equivalent to normal gain operation of the amplifier. This voltage is established by the relative magnitudes of resistors 100 and 102. If the negative voltage on capacitor 38 is less than this normal value as a result of a low level input signal prior to operation of the gate circuit, diode 104 is rendered conductive and the charge on capacitor 38 will equalize with the charge on the capacitor 98, thereby returning the gain of the amplifier to normal during the gating period. Accordingly, noise or audience sounds occurring prior to resumption of the normal amplifier input signal will not be unduly amplified.

While the invention has been particularly shown and described with reference to a preferred embodiment thereof, it will be understood by those skilled in the art that various modifications in form and details may be made therein without departing from the spirit and scope of the invention as set forth in the appended claims.

We claim:

1. A gain control arrangement for a variable gain amplifier comprising, means coupled to the output of said amplifier for developing a control voltage, storage means coupled to said control voltage developing means for retaining said control voltage and for applying said control voltage to said amplifier to control the gain thereof, means coupled to said amplifier for preventing a decrease in said stored control voltage until the output signal level of said amplifier has diminished by a preselected value, gate means coupled between said amplifier and said storage means for preventing any decrease in said stored control voltage while the input signal level to said amplifier is below a preselected threshold amplitude, and circuit means coupled between said gate means and said storage means and operative after a given period of actuation of said gate means for adjusting the value of said stored control voltage to a predetermined magnitude.

2. A gain control arrangement for a variable gain amplifier comprising, means coupled to the output of said amplifier for developing a control voltage, storage means coupled to said control voltage developing means for retaining said control voltage and for applying said control voltage to said amplifier to control the gain thereof, means coupled to the output of said amplifier for preventing a rapid decrease in said stored control voltage until the output signal level of said amplifier has diminished by a preselected value, means coupled to said storage means for slowly decreasing said stored control voltage until the output signal level of said amplifier has diminished by said preselected value, gate means coupled between said amplifier and said storage means for preventing any rapid decrease in said stored control voltage while the input signal level to said amplifier is below a preselected threshold amplitude, and circuit means coupled between said gate means and said storage means and responsive to operation of said gate means for rendering ineffective said means for slowly decreasing said stored control voltage.

3. A gain control arrangement for a variable gain amplifier comprising, means coupled to the output of said amplifier for developing a control voltage, storage means coupled to said control voltage developing means for retaining said control voltage and for applying said control voltage to said amplifier to control the gain thereof, means coupled to the output of said amplifier for preventing a rapid decrease in said stored control voltage until the output signal level of said amplifier has diminished by a preselected value, means coupled to said storage means for slowly decreasing said stored control voltage until the output signal level of said amplifier has diminished by said preselected value, gate means coupled between said amplifier and said storage means for preventing any rapid decrease in said stored control voltage while the input signal level to said amplifier is below a preselected threshold amplitude, first circuit means coupled between said gate means and said storage means and responsive to initiation of operation of said gate means for rendering ineffective said means for slowly decreasing said stored control voltage, and additional circuit means coupled between said gate means and said storage means and operative after a given period of operation of said gate means for adjusting the value of said stored control voltage to a predetermined magnitude.

4. In an amplifier gain control arrangement including storage capacitor means for holding and applying a voltage to said amplifier to control its gain as a function of the amplifier signal level and gate means coupled between said amplifier and said storage capacitor means and operative to prevent a change in the control voltage applied to said amplifier when the signal input thereto falls below a predetermined threshold level, circuit means coupled to said storage capacitor means for providing a slow discharge path for said storage capacitor means, and means coupled between said gate means and said circuit means and responsive to the output of said gate means for rendering said discharge path effectively non-conducting while said gate means is operative.

5. In an amplifier gain control arrangement including storage capacitor means for holding and applying a voltage to said amplifier to control its gain as a function of the amplifier signal level and gate means coupled between said amplifier and said storage capacitor means and operative to prevent a change in the control voltage applied to said amplifier when the signal input thereto falls below a predetermined threshold level, means including a first unidirectionally conducting device and a resistance element connected in series across said storage capacitor means to provide a slow discharge path therefor, and a second unidirectionally conducting device connected between said gate means and the common junction of said first device and said resistance element to render said discharge path effectively non-conducting while said gate means is operative.

6. In an amplifier gain control arrangement including storage capacitor means for holding and applying a control voltage to said amplifier to control its gain as a function of the amplifier signal level and gate means coupled between said amplifier and said storage capacitor means and operative to prevent a change in the control voltage applied to said amplifier when the signal input thereto falls below a predetermined threshold level, circuit means coupled to said gate means and responsive to a predetermined period of operation thereof to develop a given voltage, and means coupling said circuit means to said storage capacitor means to increase the control voltage stored therein to the level of said given voltage.

7. In an amplifier gain control arrangement including storage capacitor means for holding and applying a control voltage to said amplifier to control its gain as a function of the amplifier signal level and gate means coupled between said amplifier and said storage capacitor means and operative to prevent a change in the control voltage applied to said amplifier when the signal input thereto falls below a predetermined threshold level, parallel resistance-capacitance circuit means coupled to said gate means and responsive to a predetermined period of operation thereof to develop a given voltage, and a unidirectionally conducting device coupling said circuit means to said storage capacitor means to increase the control voltage stored therein to the level of said given voltage when the stored control voltage is less than the given voltage.

8. In an amplifier control arrangement of the platform type including storage capacitor means for holding and applying a control voltage to said amplifier to control its gain as a function of the amplifier signal level and gate means coupled between said amplifier and said storage capacitor means and operative to prevent a change in the control voltage applied to said amplifier when the signal input thereto falls below a predetermined threshold level, first circuit means coupled to said storage capacitor means for providing a slow discharge path for said storage capacitor means, means coupled between said gate means and said first circuit means and responsive to the output of said gate means for rendering said discharge path effectively non-conducting while said gate means is operative, additional circuit means coupled to said gate means and responsive to a predetermined period of operation thereof to develop a given voltage, and means coupling said circuit means to said storage capacitor means to increase the control voltage stored therein to the level of said given voltage when the stored control voltage is less than the given voltage.

9. In an amplifier gain control arrangement of the platform type including storage capacitor means for holding and applying a control voltage to said amplifier to control its gain as a function of the amplifier signal level and gate means coupled between said amplifier means and said storage capacitor means and operative to prevent a change in the control voltage applied to said amplifier when the signal input thereto falls below a predetermined threshold level, means including a first unidirectionally conducting device and a resistance element connected in series across said storage capacitor means to provide a slow discharge path therefor, a second unidirectionally conducting device connected between said gate means and the common junction of said first device and said resistance element to render said discharge path effectively non-conducting while said gate means is operative, parallel resistance-capacitance circuit means coupled to said gate means and responsive to a predetermined period of operation thereof to develop a given voltage, and a third unidirectionally conducting device coupling said circuit means to said storage capacitor means to increase the control voltage stored therein to the level of said given voltage when the stored control voltage is less than the given voltage.

References Cited by the Examiner

UNITED STATES PATENTS

| | | | |
|---|---|---|---|
| 2,585,890 | 2/1952 | Wolfe | 330—134 |
| 2,925,476 | 2/1960 | Atlas | 330—138 |
| 3,109,989 | 11/1963 | Muir | 330—140 X |
| 3,187,268 | 6/1965 | Bauer et al. | 330—123 |

FOREIGN PATENTS

| | | |
|---|---|---|
| 807,780 | 1/1959 | Great Britain. |

ROY LAKE, *Primary Examiner.*

R. P. KANANEN, *Assistant Examiner.*